US009626264B2

(12) United States Patent
Yeom et al.

(10) Patent No.: US 9,626,264 B2
(45) Date of Patent: Apr. 18, 2017

(54) MEMORY DEVICE TEST APPARATUS AND METHOD HAVING MULTIPLE MEMORY DEVICES CONNECTED TO DOWNSTREAM PORTS OF A PCI EXPRESS SWITCH AT THE SAME TIME

(71) Applicants: Neosem Inc., Anyang-si, Gyeonggi-do (KR); Tanisys Technology, Inc., Austin, TX (US)

(72) Inventors: Dong Hyun Yeom, Anyang-si (KR); Bruce A. Parker, Austin, TX (US)

(73) Assignees: Neosem Inc., Gyeonngi-do (KR); Tanisys Technology, Inc., Austin, TX (US)

( * ) Notice: Subject to any disclaimer, the term of this patent is extended or adjusted under 35 U.S.C. 154(b) by 85 days.

(21) Appl. No.: 14/661,390

(22) Filed: Mar. 18, 2015

(65) Prior Publication Data
US 2016/0092328 A1 Mar. 31, 2016

(30) Foreign Application Priority Data
Sep. 30, 2014 (KR) .................. 10-2014-0130710

(51) Int. Cl.
*G06F 13/42* (2006.01)
*G06F 11/26* (2006.01)
(Continued)

(52) U.S. Cl.
CPC .......... *G06F 11/26* (2013.01); *G06F 13/4022* (2013.01); *G06F 13/4282* (2013.01); *G01R 31/3193* (2013.01)

(58) Field of Classification Search
CPC .. G06F 11/26; G06F 13/4022; G06F 13/4282; G01R 31/3193
(Continued)

(56) References Cited

U.S. PATENT DOCUMENTS 5,928,373 A * 7/1999 Yoo ................ G11C 29/20
714/718
7,149,939 B2 * 12/2006 Michael ............ G11C 29/56
714/719
(Continued)

FOREIGN PATENT DOCUMENTS

KR 10-0911252 B1 8/2009
KR 10-0923832 B1 10/2009
(Continued)

OTHER PUBLICATIONS

"PCI Express Multi-Root Switch Reconfiguration During System Operation" by Heymian Wong S.B. EECS, M.I.T., 2010 Submitted to the Department of Electrical Engineering and Computer Science Massachusetts Institute of Technology archives, Jun. 21, 2011.*
(Continued)

*Primary Examiner* — Cynthia Britt
(74) *Attorney, Agent, or Firm* — Panitch Schwarze Belissario & Nadel LLP (57) ABSTRACT

Disclosed herein are a method and an apparatus for shortening a data comparison test time by using peer-to-peer transfers between peripheral component interconnect express (PCIe) endpoints when testing solid state drive (SSD) devices. A memory device test apparatus performing a data comparison test of a memory device mounted in a downstream port of a peripheral component interconnect express (PCIe) switch by performing a writing process and a reading-back process by a control of a host central processing unit (CPU) includes: a comparison test unit (FPGA) connected to the downstream port of the PCIe switch, performing peer-to-peer communication with the memory device to supply write data to the memory device and receive read-back data from the memory device, and performing the data comparison test.

11 Claims, 6 Drawing Sheets

(51) Int. Cl.
*G06F 13/40* (2006.01)
*G01R 31/3193* (2006.01)

(58) Field of Classification Search
USPC .................................................... 714/719
See application file for complete search history.

(56) References Cited

U.S. PATENT DOCUMENTS

| | | | | | |
|---|---|---|---|---|---|
| 8,051,343 | B2* | 11/2011 | Shin | ............... | G11C 29/08 |
| | | | | | 326/86 |
| 8,108,741 | B2* | 1/2012 | Kim | ............... | G11C 29/28 |
| | | | | | 365/201 |
| 2002/0194558 | A1* | 12/2002 | Wang | ............ | G01R 31/318547 |
| | | | | | 714/718 |
| 2003/0076125 | A1* | 4/2003 | McCord | ......... | G01R 31/318505 |
| | | | | | 324/754.07 |
| 2014/0236525 | A1* | 8/2014 | Chan | ............... | G01R 31/31907 |
| | | | | | 702/119 |
| 2015/0095712 | A1* | 4/2015 | Han | ............... | G11C 29/1201 |
| | | | | | 714/42 |
| 2015/0135026 | A1* | 5/2015 | Lai | ............... | G11C 29/08 |
| | | | | | 714/718 |
| 2015/0234763 | A1* | 8/2015 | Kline | ............ | G06F 13/4282 |
| | | | | | 710/313 |
| 2015/0234764 | A1* | 8/2015 | Kline | ............ | G06F 13/126 |
| | | | | | 710/5 |
| 2015/0254202 | A1* | 9/2015 | McGlone | ............ | G06F 13/4022 |
| | | | | | 710/316 |

FOREIGN PATENT DOCUMENTS

| | | |
|---|---|---|
| KR | 10-0979248 B1 | 9/2010 |
| KR | 10-1090454 B1 | 12/2011 |

OTHER PUBLICATIONS

P. Pellati and P. Olivo, "Automated test equipment for research on nonvolatile memories," in IEEE Transactions on Instrumentation and Measurement, vol. 50, No. 5, pp. 1162-1166, Oct 2001.*

* cited by examiner

FIG. 1

(PRIOR ART)

FIG. 2

(PRIOR ART)

MEMORY DEVICE TEST APPARATUS AND METHOD HAVING MULTIPLE MEMORY DEVICES CONNECTED TO DOWNSTREAM PORTS OF A PCI EXPRESS SWITCH AT THE SAME TIME

CROSS-REFERENCE TO RELATED APPLICATION

This application claims the benefit of Korean Patent Application No. 10-2014-0130710 filed on Sep. 30, 2014, with the Korean Intellectual Property Office, the invention of which is incorporated herein by reference.

TECHNICAL FIELD

The present invention relates to a memory device test apparatus and method, and more particularly, to a method and apparatus for shortening a data comparison test time by using peer-to-peer transfers between peripheral component interconnect express (PCIe) endpoints when testing solid state drive (SSD) devices.

BACKGROUND

Among semiconductor devices, a solid state drive (SSD) device storing information using a semiconductor device such as a flash memory unlike a hard disk drive (HDD), which is a mechanical apparatus, in spite of being operated similarly to the HDD, has become recently prominent as the next generation storage apparatus that will replace the HDD.

The SSD device has been used in order to replace the HDD used in a computer or a mini hard disk used in a mobile terminal. Since the SSD device stores data using the semiconductor device such as the flash memory, it does not generate mechanical movement as compared with the HDD, and may decrease a long search time, latency time, and mechanical delay time, which are problems of the HDD.

The SSD device generally has NAND flash memories configured in an array to implement a large storage area. The flash memories configuring the SSD device should be thoroughly tested in a manufacturing step to identify all defects in the flash memory array. In this SSD device test, a significant time is required for a data comparison test for the flash memories.

A typical method for implementing the data comparison test is to write a known pattern to the flash memory, read back contents of the flash memories, and then compare the read-back data with the written known pattern.

Figure 1:
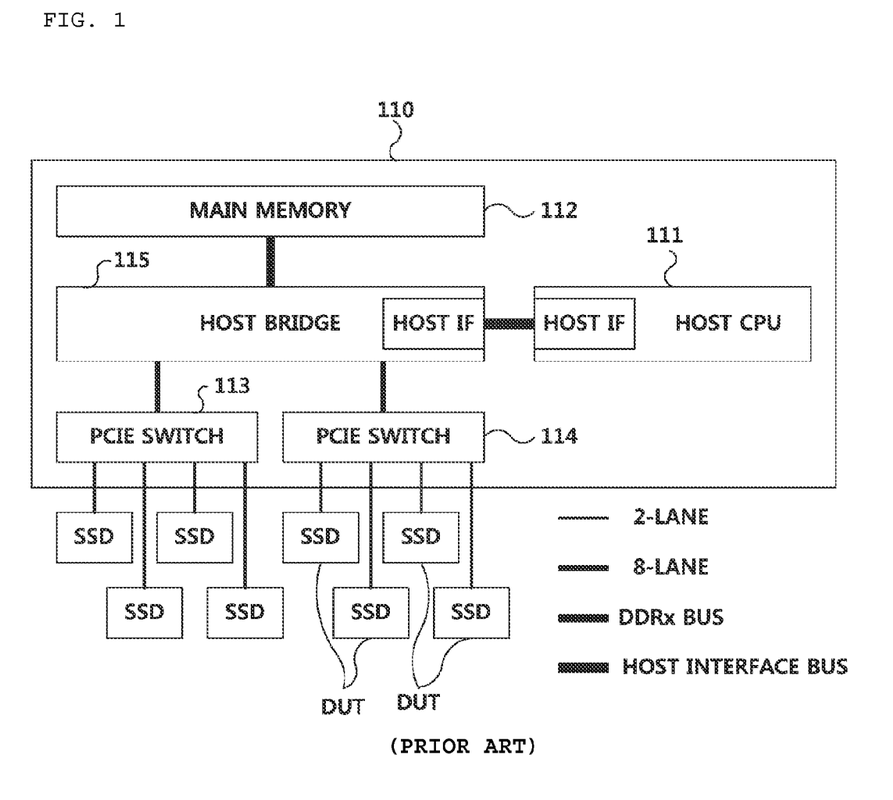
FIG. 1 is a schematic block diagram showing a memory device test apparatus for a general data comparison test.
Figure 2:
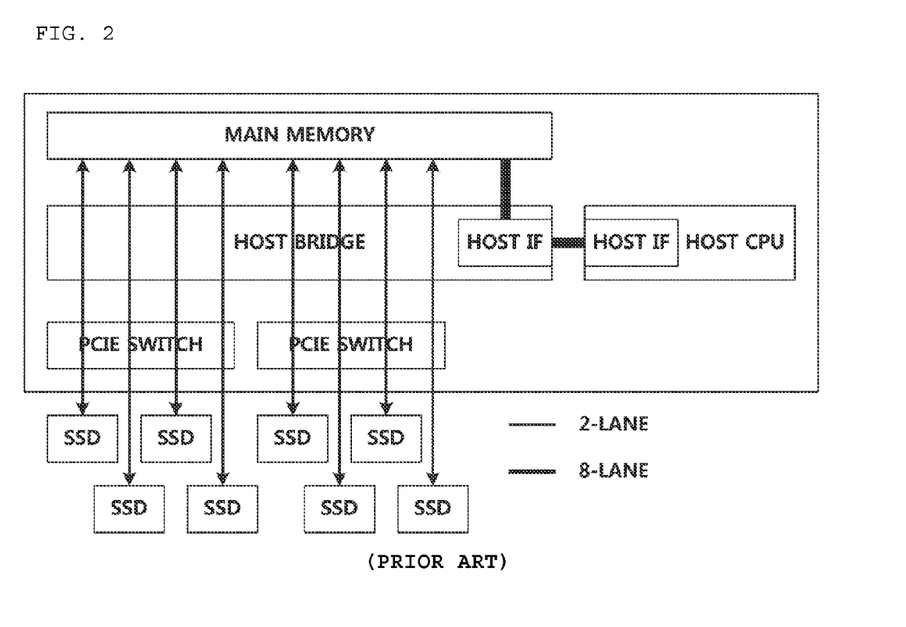
FIG. 2 is a diagram showing a data flow in a data comparison test process in a system architecture of FIG. 1.

FIG. 1 is a schematic block diagram showing a memory device test apparatus for a general data comparison test; and FIG. 2 is a diagram showing a data flow in a data comparison test process in a system architecture of FIG. 1.

The memory device test apparatus is implemented by a host system 110 that includes a host central processing unit (CPU) 111, a main memory 112, multiple peripheral component interconnect express (PCIe) switches 113 and 114, and a host bridge 115 communicating and connecting between the host CPU 111, the main memory 112, and the PCIe switches 113 and 114. Multiple test target SSD devices (DUTs) are mounted as PCIe devices in downstream ports of the PCIe switches 113 and 114. Although the SSD devices are shown as test targets in the accompanying drawings, the present invention is not limited thereto, but may be used for a data comparison test of a memory device such as a flash memory, or the like. The respective SSD devices are connected to the PCIe switches 113 and 114 with two lanes.

An example in which two PCIe switches 113 and 114 are mounted in the host system 110 and four SSD devices (DUTs) are mounted in the PCIe switches 113 and 114, respectively, is shown in FIG. 1. Each DUT is a 2-lane PCIe device, and since a total of eight DUTs are connected to the PCIe switches, the host bridge 115 should include sixteen lanes.

A data comparison test process using the SSD test apparatus according to the related art configured as described above will be described. As described above, the data comparison test process includes a writing process, a reading-back process, and a data comparing process, and each process in a traditional processor architecture system includes the following several detailed steps.

First, the known data pattern should be copied from a storage (not shown) to the main memory or be generated by a test code. In this case, a required time is determined by a storage medium of the host system 110 (in which data are stored) and a bandwidth of the main memory 112 of the host system 110. That is, it takes a time for the host system 110 to copy the known data pattern from a hard drive or a network position into the main memory 112.

Next, in the writing process, the data pattern should be written in the SSD device (DUT). That is, the data stored in the main memory 112 are moved from the main memory 112 to the SSD device through any interface supported by the SSD device. A time required for the writing process is also determined by the bandwidth of the main memory 112 of the host system 110 and/or all interface protocols present between the main memory 112 of the host system 110 and an interface to the SSD device (DUT).

Next, in the reading-back process, when the data are recorded, the host system 110 should read back contents written in the SSD device (DUT). In the reading-back process, the data should again pass through a protocol interface between the SSD device (DUT) and the host system 110 and an interface of the main memory 112 of the host system 110. In this case, the host system 110 should store both of the known data pattern and the data read-back from the SSD device (DUT) in the main memory 112.

Next, in the comparing process, the host system 110 should compare two data chucks; the known data and the read-back data with each other. The host system 110 should read the two data chucks from the main memory 112 in order to compare the data with each other. In this case, a time cost is again required for accessing the main memory 112.

In summary, the data pattern is generated by the host CPU 111 and is stored in the main memory 112. In the writing process, the data flow from the main memory 112 to the SSD device (DUT) while crossing all bandwidth limiting paths of the host bridge 115. In the reading-back process, the data again flow from the SSD device (DUT) to the main memory 112 while crossing all the bandwidth limiting paths of the host bridge 115. In addition, these processes should be repeated for all the SSD devices (DUT) mounted in the host system. That is, in all the processes of the data comparison test, all the data for testing all the SSD devices (DUTs) should be written in the main memory or be read from the main memory.

Therefore, an entire time required for the data comparison test is mainly determined by the bandwidth of the main memory 112 of the host system 110 and the bandwidth of the protocol between the host system 110 and the SSD device (DUT). Since modern SSD devices drive a very high speed serial protocol, a very high speed memory interface is required in order to maintain a bandwidth required for testing a single SSD device.

Since a considerable part of a hardware cost in an SSD device test apparatus is a host CPU subsystem, the test apparatus generally supports a test for one or more SSD device per CPU subsystem. The system architecture provides independent high speed serial protocol interfaces for each SSD device supported by one CPU. In the case in which the CPU supports tests for multiple SSD devices, the bandwidth of the main memory of the host system always becomes a bottleneck during a data comparison test, which causes a test time bottleneck.

RELATED ART DOCUMENT

Korean Patent No. 0979248
Korean Patent No. 0911252
Korean Patent No. 1090454
Korean Patent No. 0923832

SUMMARY

An object of the present invention is to provide a memory device test apparatus and method capable of shortening a time required for a data comparison test of memory devices including solid state drive (SSD) devices.

According to an exemplary embodiment of the present invention, there is provided a memory device test apparatus of performing a data comparison test of a memory device mounted in a downstream port of a peripheral component interconnect express (PCIe) switch by performing a writing process and a reading-back process by a control of a host central processing unit (CPU), including: a comparison test unit connected to the downstream port of the PCIe switch, performing peer-to-peer communication with the memory device to supply write data to the memory device and receive read-back data from the memory device, and performing the data comparison test.

According to another exemplary embodiment of the present invention, there is provided a memory device test method of a memory device test apparatus in which a comparison test unit mounted in a downstream port of a PCIe switch performs a data comparison test of a memory device mounted in the downstream port of the PCIe switch, including: a writing process step in which the comparison test unit drives a data generating algorithm to generate a write data and supply the generated write data to the memory device; a reading-back process step in which the comparison test unit drives the data generating algorithm to generate expected data and compares read-back data supplied from the memory device and the expected data with each other; and a result information storing step in which the comparison test unit stores comparison result information of the reading-back process step therein.

BRIEF DESCRIPTION OF DRAWINGS

The above and other aspects, features and other advantages of the present invention will be more clearly understood from the following detailed description taken in conjunction with the accompanying drawings, in which.

DETAILED DESCRIPTION

Hereinafter, the present invention will be described in detail with reference to the accompanying drawings.

Exemplary embodiments to be provided below are provided byway of example so that the spirit of the present invention may be sufficiently transferred to those skilled in the art. Therefore, the present invention is not limited to exemplary embodiments to be described below, but may be implemented in other forms. Like reference numerals denote like components throughout the present specification. Abbreviations mentioned throughout the present specification should be interpreted as generally understood in the related art unless separately mentioned in the present specification.

Figure 3:
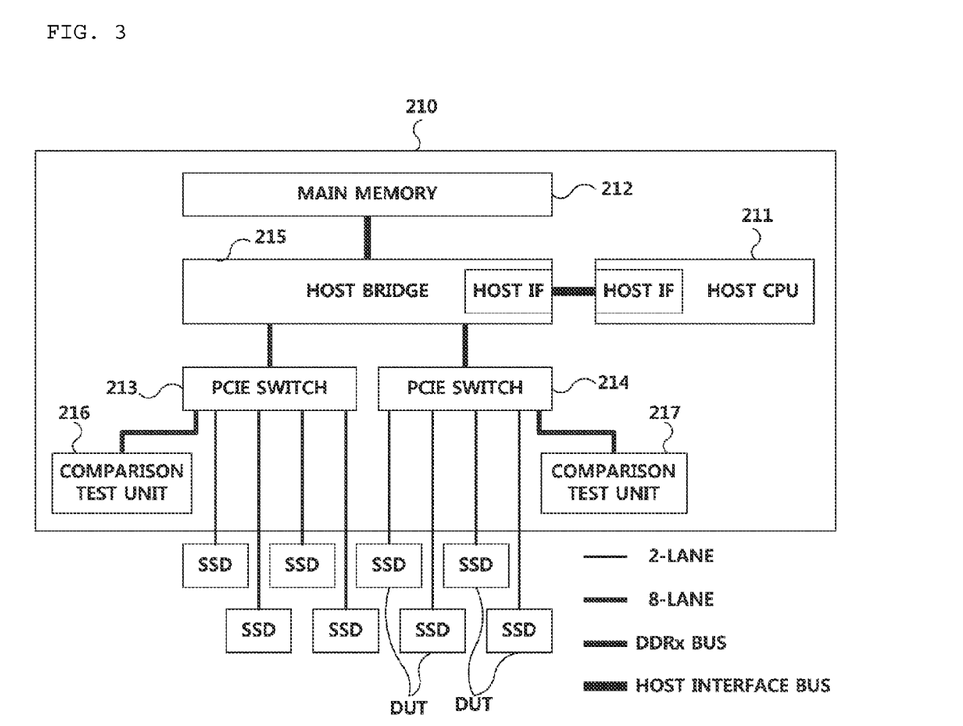
FIG. 3 is a block diagram showing a system architecture of a memory device test apparatus according to an exemplary embodiment of the present invention.
Figure 4:
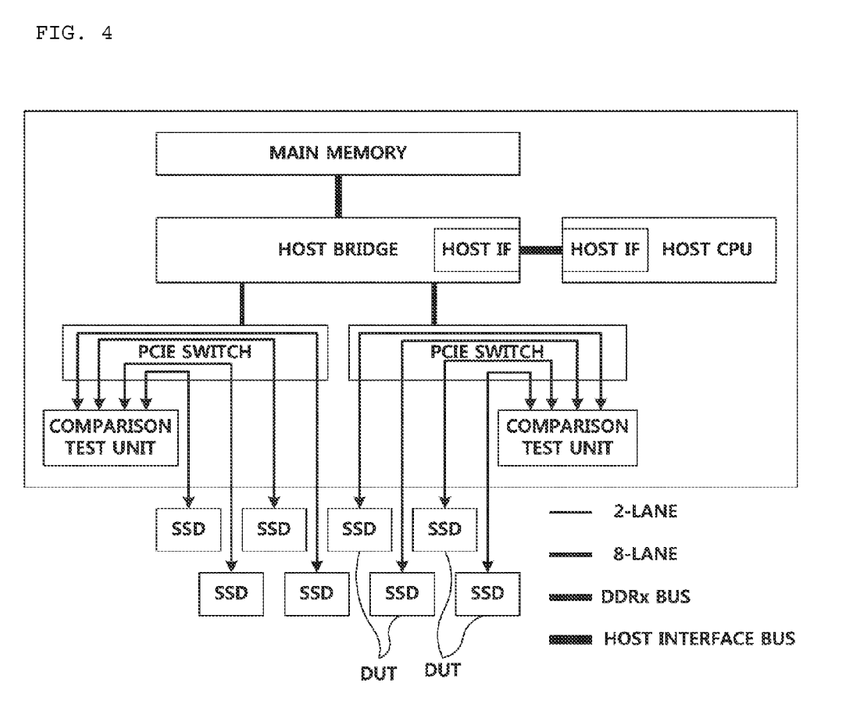
FIG. 4 is a diagram showing a data flow in a data comparison test process in a system architecture of FIG. 3.

FIG. 3 is a block diagram showing the system architecture of a memory device test apparatus according to an exemplary embodiment of the present invention; and FIG. 4 is a diagram showing a data flow in a data comparison test process in a system architecture of FIG. 3.

The memory device test apparatus according to an exemplary embodiment of the present invention is implemented by a host system 210 that includes a host central processing unit (CPU) 211, a main memory 212, multiple peripheral component interconnect express (PCIe) switches 213 and 214, and a host bridge 215 communicating and connecting between the host CPU 211, the main memory 212, and the PCIe switches 213 and 214.

Multiple test target SSD devices (DUTs) are mounted as PCIe devices in downstream ports of the PCIe switches 213 and 214. Although the SSD devices are shown as test targets in the accompanying drawings, the present invention is not limited thereto, but may be used for a data comparison test of a memory device such as a flash memory, or the like. The respective SSD devices are connected to the respective PCIe switches 213 and 214 with two lanes.

In addition, comparison test units 216 and 217 are additionally connected to the downstream ports of the PCIe switches 213 and 214, respectively. The comparison test units 216 and 217 may be implemented by a field programmable gate array (FPGA) device configured as a PCIe endpoint. The comparison test units 216 and 217 have a PCIe lane bandwidth and are connected to the PCIe switches, respectively. It is preferable that the PCIe lane bandwidth is the same as the sum of all PCIe lane bandwidths of all the SSD devices mounted in the PCIe switches. This ensures sufficient bandwidth to test all of the connected SSD devices concurrently. In illustrative diagrams, since four SSD devices are mounted in the PCIe switch 214 and each of the SSD devices is a 2-lane PCIe device, the comparison test unit 217 is connected to the PCIe switch 214 with eight lanes, such that it may maintain a bandwidth required for testing the respective SSD devices concurrently (parallel testing).

The PCIe switches 213 and 214 support a PCIe peer-to-peer transfer. This means that one endpoint connected to the downstream port of the PCIe switch may transfer data to/from another endpoint connected to another downstream port of the same PCIe switch. In the above-mentioned peer-to-peer transfer, the data need not flow toward an upstream port of the PCIe switch. That is, the data flows only between downstream endpoints through the PCIe switches and does not pass through the upstream ports of the PCIe switches, as shown in FIG. 4.

Figure 5:
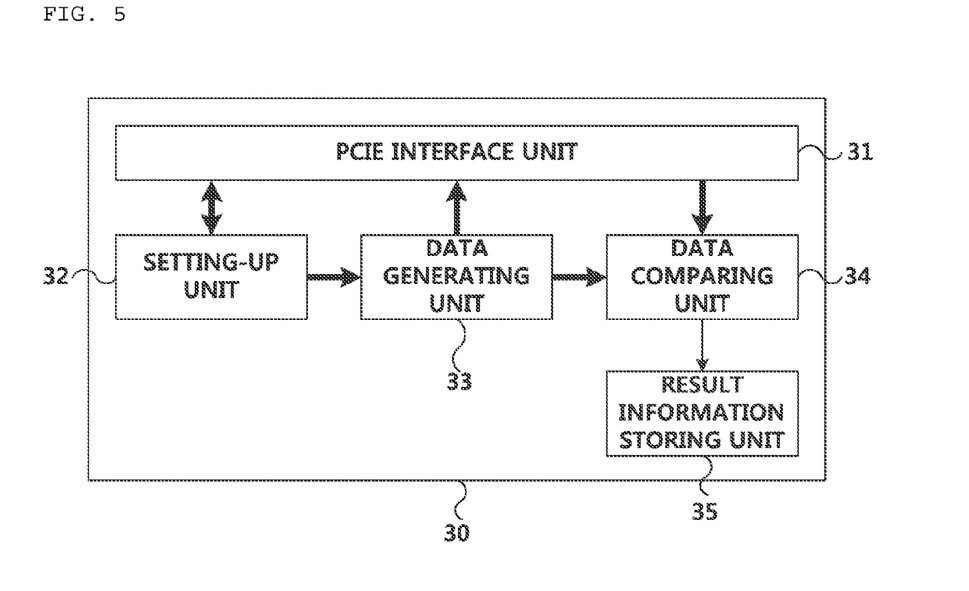
FIG. 5 is a diagram showing internal components of a comparison test unit according to an exemplary embodiment of the present invention.

FIG. 5 is a diagram showing internal components of a comparison test unit according to an exemplary embodiment of the present invention.

The comparison test unit 30 is a PCIe endpoint implemented by an FPGA. The comparison test unit 30 allows writing from the comparison test unit 30 to the SSD device and reading from the SSD device to the comparison test unit 30 in order to support the data comparison test. However, the comparison test unit does not include an external random access memory (RAM) in which the data are stored. Instead, the data are generated by an internal algorithm of the comparison test unit in both of a writing process from the comparison test unit to the SSD device and a reading-back process from the SSD device to the comparison test unit. An algorithm for generating the data is generally based on information embedded in the data transfer request to/from the target SSD Device, such as the target address and transfer size.

The comparison test unit 30 may include a PCIe interface unit 31 performing an interface to the PCIe switch, a setting-up unit 32 setting-up the data generating algorithm, such as the transfer address and size corresponding to the test target SSD device, a data generating unit 33 generating data corresponding to the selected algorithm (such as address and transfer size) in the writing process and the reading-back process and supplying the data generated in the writing process to the SSD device, and a data comparing unit 34 comparing the data generated by the data generating unit 33 in the reading-back process and the data read-back from the SSD device with each other. The setting-up unit 32 may include multiple data setting-up algorithms useable in the data generating unit 33 and set up data setting-up algorithms used in the data generating unit 33. The comparison test unit 30 further includes a result information storing unit 35 storing comparison result information of the data comparing unit 34 therein.

The data generating unit 33 of the comparison test unit 30 drives a data generating algorithm in a 'writing process to the SSD device' to generate the data and supply the generated data to the SSD device without storing the generated data. In addition, the comparison test unit 30 does not store data read-back from the SSD device in a 'reading-back process from the SSD device'. However, the data generating unit 33 of the comparison test unit 30 drives the same data generating algorithm as the data generating algorithm in the 'writing process' in the reading-back process' to generate the same data, and the data comparing unit 34 compares the data read-back from the SSD device and the data generated from the data generating unit 33 with each other in real time. Here, the address and the size embedded in the transfer request of the SSD device, which is the test target set-up by the setting-up unit 32, are used as key values of the data generating algorithm of the data generating unit 33.

The data comparing unit 34 stores a comparison result between the data read-back from the SSD device and the data generated from the data generating unit 33 in the result information storing unit 35. For example, in the case in which the data read-back from the SSD device and the data generated from the data generating unit 33 do not coincide with each other as the comparison result, non-coincidence information is stored in the result information storing unit 35. As the comparison result, the result information storing unit 35 may store information and data associated with comparison failure therein. The number of failures (faults) stored in the result information storing unit 35 may be limited due to a restrictive capacity of an internal memory, and this limitation depends on a size and a type of the FPGA implementing the comparison test unit 30. Usually, this is not a large disadvantage since the number of failures in the data comparison test of the SSD device should not be large, and will be sufficient to identify that the SSD device is a faulted device even though some of the failures are captured.

The comparison test unit 30 may be actually considered to have an unrestricted memory address space since it does not store the write data and the read-back data in an external memory bank.

Next, a process in which the host CPU performs the data comparison test through the writing process, the reading-back process, and the comparing process when using the system architecture according to an exemplary embodiment of the present invention will be described.

The writing of the data to the SSD device and the reading-back of the data from the SSD device may be normally accomplished by setting-up DMA type descriptors that the SSD device uses to transfer the data.

In the case in which the data are written to the SSD device in the writing process, the host CPU sets up descriptors so that the SSD device may read "write" data from a desired position. That is, the writing of the data to the SSD device is implemented by allowing the SSD device to substantially perform a reading transaction in a hardware level. In the present invention, as a result, this may be implemented by allowing a target of an SSD reading transaction to become the comparison test unit 30 instead of the main memory of the host system.

In the case in which the data are read back from the SSD device in the reading-back process, the host CPU sets up descriptors so that the SSD device may write "read-back" data from a desired position. That is, the reading of the data from the SSD device is implemented by allowing the SSD device to substantially perform a writing transaction in the hardware level. In the present invention, as a result, this may be implemented by allowing a target of an SSD writing transaction to become the comparison test unit 30 instead of the main memory of the host system.

Figure 6:
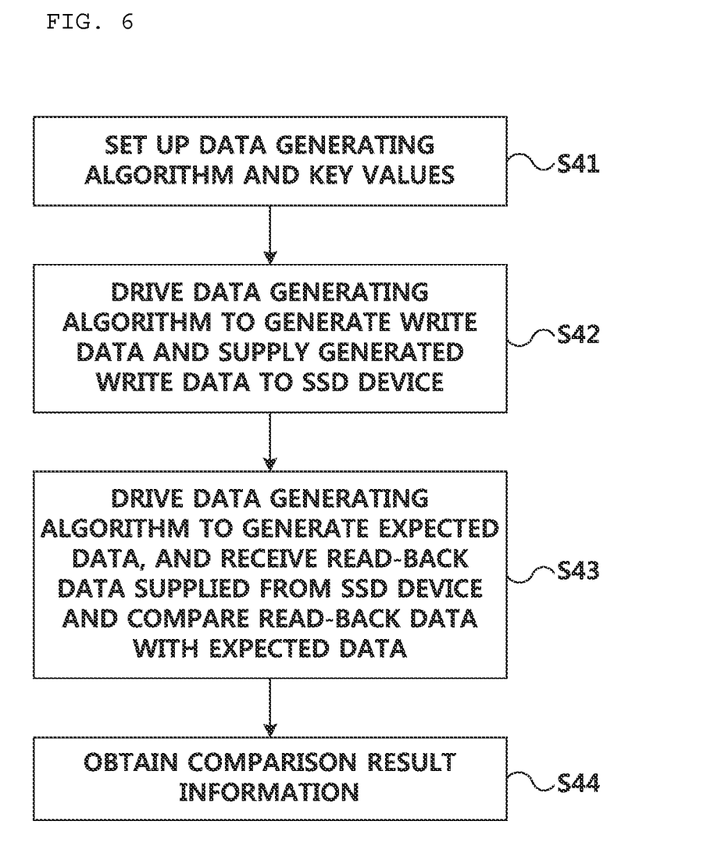
FIG. 6 is an operation flowchart showing a data comparison test method according to an exemplary embodiment of the present invention.

FIG. 6 is an operation flow chart showing a data comparison test method for a memory device according to an exemplary embodiment of the present invention.

First, a data generating algorithm and key values that are to be used in the comparison test unit 30 are established (S41). Since the comparison test unit 30 is implemented by the FPGA, this may be performed by a general method of establishing a configuration register in the FPGA. One or multiple data generating algorithms selectable by the comparison test unit 30 may be present, and an image of another FPGA may be loaded to implement a unique algorithm.

Next, data are written to the SSD device (S42). The host CPU sets up and enables peer-to-peer transfers between the SSD device and the comparison test unit 30 in the PCIe switches, and sets up transfer descriptors so as to enable the SSD device to read the "write" data from the comparison test unit 30 through the peer-to-peer transfers. In this case, the data generating unit 33 of the comparison test unit 30 drives the data generating algorithm to generate the "write" data and supplies the "writing" data to the SSD device.

Next, the data are read back from the SSD device and are compared with each other (S43). The host CPU sets up transfer descriptors so as to enable the SSD device to write the "read-back" data to the comparison test unit 30 through the peer-to-peer transfers. In this case, the data generating unit 33 drives the data generating algorithm to generate expected data, and the data comparing unit 34 compares the "read-back" data supplied from the SSD device and the expected data with each other and stores a comparison result to the result information storing unit 35.

Next, the host CPU obtains the comparison results from the comparison test unit 30 (S44). That is, the host CPU reads the result information storing unit 35 of the comparison test unit 30 to search comparison error information. The result information storing unit 35 may be provided in an internal register and/or an internal memory space.

According to an exemplary embodiment of the present invention, in the data comparison test, a data flow is maintained only at downstream sides of the PCIe switches. Therefore, a bandwidth problem associated with upstream bus interfaces of the PCIe switches may be removed. This technology also removes an overhead task of performing the data comparison from the host CPU, thereby making it possible to secure CPU cycles for the host CPU to perform other tasks during data comparison testing.

As set forth above, according to exemplary embodiments of the present invention, a bandwidth bottleneck in a host subsystem is removed in a data comparison path, such that a data comparison test time for the SSD device may be substantially shortened.

In addition, the bandwidth bottleneck in the host subsystem is removed, such that one host subsystem may perform a data comparison test for a larger number of SSD devices (DUTs) without having a negative effect on individual DUT test times. This architecture may allow a host subsystem having a lower specification to test high speed SSD devices (DUTs).

What is claimed is:

1. A memory device test apparatus of performing a data comparison test of a memory device mounted in a downstream port of a peripheral component interconnect express (PCIe) switch by performing a writing process and a reading-back process by a control of a host central processing unit (CPU), comprising:
   a comparison test unit connected to the downstream port of the PCIe switch, performing peer-to-peer communication with the memory device to supply write data to the memory device and receive read-back data from the memory device, and performing the data comparison test,
   wherein the PCIe switch includes at least two or more downstream ports, each of the downstream ports being respectively connected to each of memory devices having the same lane bandwidth, and
   wherein a PCI lane bandwidth of the comparison test unit is the same as the sum of all lane bandwidths of all the memory devices mounted in the PCIe switch, and the comparison test unit maintains the bandwidth required for testing each of the memory devices.

2. The memory device test apparatus of claim 1, wherein the comparison test unit is a PCIe endpoint implemented by a field programmable gate array (FPGA).

3. The memory device test apparatus of claim 1, wherein the comparison test unit includes:
   a PCIe interface unit performing an interface to the PCIe switch;
   a data generating unit driving a data generating algorithm in the writing process to generate the write data and supply the generated write data to the memory device and driving the data generating algorithm in the reading-back process to generate expected data; and
   a data comparing unit comparing the expected data and the read-back data read from the memory device with each other.

4. The memory device test apparatus of claim 3, wherein the comparison test unit further includes a setting-up unit setting-up an algorithm based on a transfer's address and size corresponding to the memory device to key values of the data generating algorithm.

5. The memory device test apparatus of claim 4, wherein the setting-up unit further sets up the data generating algorithm.

6. The memory device test apparatus of claim 3, wherein the comparison test unit further includes a result information storing unit storing comparison result information of the date comparing unit therein.

7. A memory device test method of a memory device test apparatus which comprises a peripheral component interconnect express (PCIe) switch including at least two or more downstream ports, each of the downstream ports being respectively connected to each of memory devices having the same lane bandwidth and a comparison test unit mounted in the downstream ports of the PCIe switch, wherein a PCI lane bandwidth of the comparison test unit is the same as the sum of all lane bandwidths of all the memory devices mounted in the PCIe switch, the method comprising:
   a writing process step in which the comparison test unit drives a data generating algorithm to generate a write data and supply the generated write data to the memory devices respectively;
   a reading-back process step in which the comparison test unit drives the data generating algorithm to generate expected data and compares read-back data supplied respectively from the memory devices and the expected data with each other; and
   a result information storing step in which the comparison test unit stores comparison result information of the reading-back process step therein.

8. The memory device test method of claim 7, wherein in the writing process step and the reading-back process step, the comparison test unit sets up an address and a size corresponding to the transfer request of the memory device to key values of the data generating algorithm.

9. The memory device test method of claim 7, further comprising, before the writing process step, a setting-up step in which the comparison test unit selects the data generating algorithm among multiple data generating algorithms.

10. The memory device test method of claim 7, wherein the writing process step includes a step in which the memory device reads the write data from the comparison test unit.

11. The memory device test method of claim 7, wherein the reading-back process step includes a step in which the memory device writes the read-back data to the comparison test unit.

* * * * *